United States Patent [19]
Greenough et al.

[11] Patent Number: 5,249,117
[45] Date of Patent: Sep. 28, 1993

[54] ADAPTIVE CONTROL SYSTEMS

[75] Inventors: Rodney D. Greenough; Gordon A. Jenner, both of North Humberside; Ahmed Parvinmehir, York; Anthony J. Wilkinson, North Humberside, all of England

[73] Assignee: The Secretary of State for Defence in Her Britannic Majesty's Government of the United Kingdom of Great Britain and Northern Ireland, London, England

[21] Appl. No.: 831,742

[22] Filed: Feb. 10, 1992

Related U.S. Application Data

[63] Continuation of Ser. No. 772,136, Oct. 9, 1991, abandoned, which is a continuation of Ser. No. 449,775, Dec. 13, 1989, abandoned.

[30] Foreign Application Priority Data

Apr. 26, 1989 [GB] United Kingdom ............... 8909483

[51] Int. Cl.$^5$ ................... G06F 15/46; H02N 2/00
[52] U.S. Cl. ..................... 364/150; 318/118; 310/26
[58] Field of Search ............. 364/148–150, 364/164, 165; 318/118; 310/26–28

[56] References Cited

U.S. PATENT DOCUMENTS

| | | | |
|---|---|---|---|
| 3,932,112 | 1/1976 | Garshelis | 431/255 |
| 4,236,230 | 11/1980 | Thompson | 148/108 |
| 4,563,735 | 1/1986 | Hiroi et al. | 364/165 |
| 4,585,978 | 4/1986 | Hasselmark et al. | 318/118 |
| 4,670,843 | 6/1987 | Matsumura et al. | 364/165 |
| 4,698,745 | 10/1987 | Hiroi et al. | 364/149 |
| 4,710,656 | 12/1987 | Studer | 310/51 |
| 4,766,357 | 8/1988 | Glomb, Jr. | 318/118 |
| 4,831,909 | 5/1989 | Peters et al. | 83/433 |
| 4,849,034 | 7/1989 | Verhoeven et al. | 148/100 |
| 4,860,215 | 8/1989 | Seraji | 364/165 |
| 4,861,149 | 8/1989 | Ealey | 350/487 |
| 4,901,293 | 2/1990 | Kuhn | 310/26 |
| 4,944,222 | 7/1990 | Tyren | 101/93.29 |
| 5,039,894 | 8/1991 | Teter et al. | 310/26 |

FOREIGN PATENT DOCUMENTS

| | | | |
|---|---|---|---|
| 0040618 | 3/1983 | Japan | 364/131 |
| 0237568 | 11/1985 | Japan | 364/131 |

*Primary Examiner*—Jerry Smith
*Assistant Examiner*—Thomas E. Brown
*Attorney, Agent, or Firm*—Nixon & Vanderhye

[57] ABSTRACT

An adaptive controller employing variable structure techniques being particularly applicable to the control of processes operated by a magnetostrictive actuator.

The problem of accommodating the non-linearity and hysteresis in the magnetostrictive actuator's response is solved by this design of controller. Examples of the uses of a controller-magnetostrictive actuator combination include control of hydraulic valves and anti-vibration tables.

8 Claims, 7 Drawing Sheets

ADAPTIVE CONTROL SYSTEMS

This is a continuation of application Ser. No. 07/772,136, filed Oct. 9, 1991, now abandoned which is a continuation of Ser. No. 07/449,775, filed Dec. 13, 1989 now abandoned.

BACKGROUND OF THE INVENTION

1. Field of the Invention

This invention relates to adaptive control systems for control of a process (or plant) and is particularly applicable to the operation and control of magnetostrictive actuators.

2. Discussion of Prior Art

Actuators made from magnetostrictive materials are known to exhibit useful strains on applied loads but suffer from wide variations in response with changes in load. This, plus the presence of hysteresis in the strain versus magnetic field intensity curve known to be exhibited by these materials, renders the use of conventional adaptive control systems such as those having a linear feedback design wholly inadequate for the purpose.

SUMMARY OF THE INVENTION

It is an object of the invention to provide an adaptive control system which is able to accommodate changes in process response throughout the course of its normal operation. Therefore, the control stategy employed must be robust to variations in system gain as well as being able to adapt to changes in operating dynamics.

It is a further object of the invention to provide an adaptive control system which may be used in conjunction with a magnetostrictive actuator. Such a combination can have many applications such as control of hydraulic valves or use in anti-vibration installations.

Accordingly, the invention consists of an adaptive control system for control of a process in response to an externally generated demand signal and characterised by including:

an estimator for providing a model of the response of the process to external influences;

a control designer for comparing the response model with a stored model and for generating, as a result of said comparison, positive and negative feedback control signals which are applied to the process via one of two switched filters;

the switching between said filters being effected by a variable structure controller responsive to the demand signal.

An adaptive control system in accordance with the invention (employing self-tuning techniques in combination with variable structure techniques) is able to provide accurately tuned cancellation of any observable disturbances which affect the process to be controlled. The variable structure controller of this invention is made to operate in a discrete mode in contrast to the better known continuous mode. Unlike linear feedback controller designs the variable structure controller is able to deliver a stable closed loop system response even under conditions of extreme process modelling error.

A useful feature of the invention is a fast convergence rate of process model estimates due to the nature of the controlled process input. This is exceptionally useful in circumstances where the process model changes from its original value. This type of control strategy is most suitable for real-time process control applications since a Variable Structure Control design requires very little computation time.

The feedback control signals which are applied to the process are hazardous in real-time control systems and can rapidly cause damage to expensive and delicate actuators. However, magnetostrictive actuators are immune to this type of vigorous control signal, being solid state and therefore robust.

Hence, this type of actuator is well suited to control by a system in accordance with the invention.

A discrete sliding criterion, necessary for the operation of the variable structure controller is formulated using a discrete difference operator which, in turn, is derived from the "Delta operator". These operators are described in greater detail hereinafter.

BRIEF DESCRIPTION OF THE DRAWINGS

Some embodiments of the invention will now be described, by way of example only, with reference to the drawings of which.

DETAILED DISCUSSION OF PREFERRED EMBODIMENTS

Figure 1:
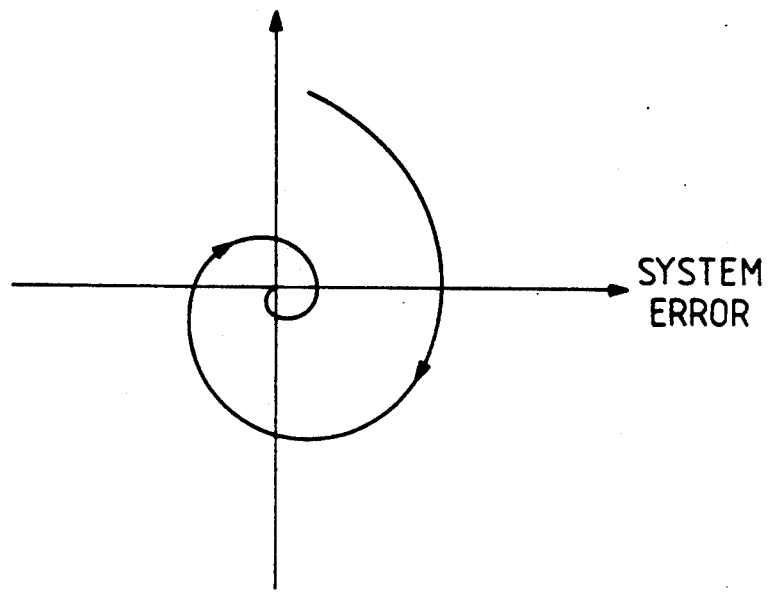
FIGS. 1 and 2 illustrate typical system error trajectories for positive and negative feedback control systems respectively.
Figure 2:
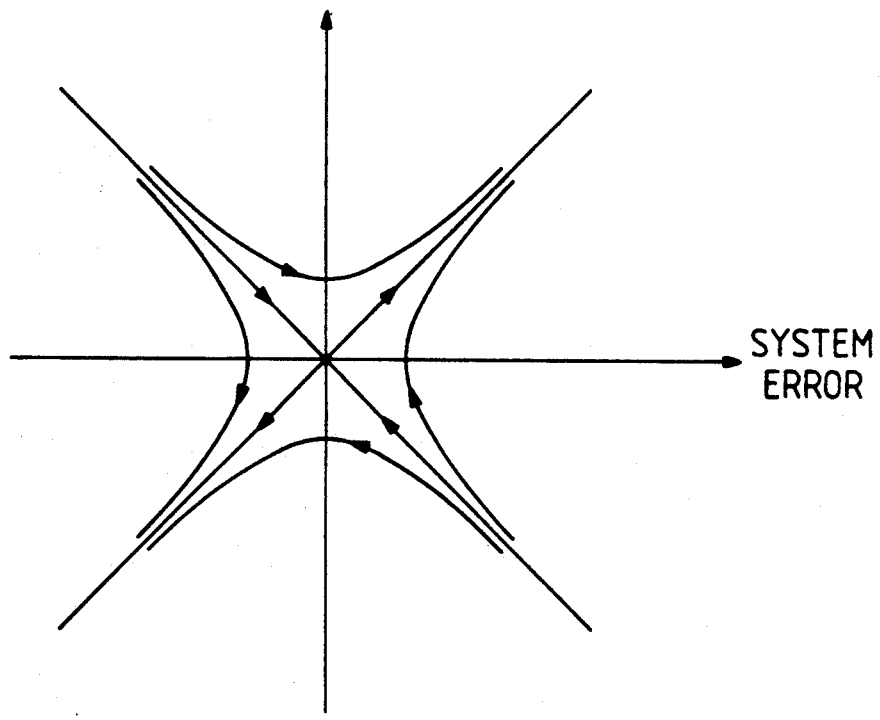
Figure 3:
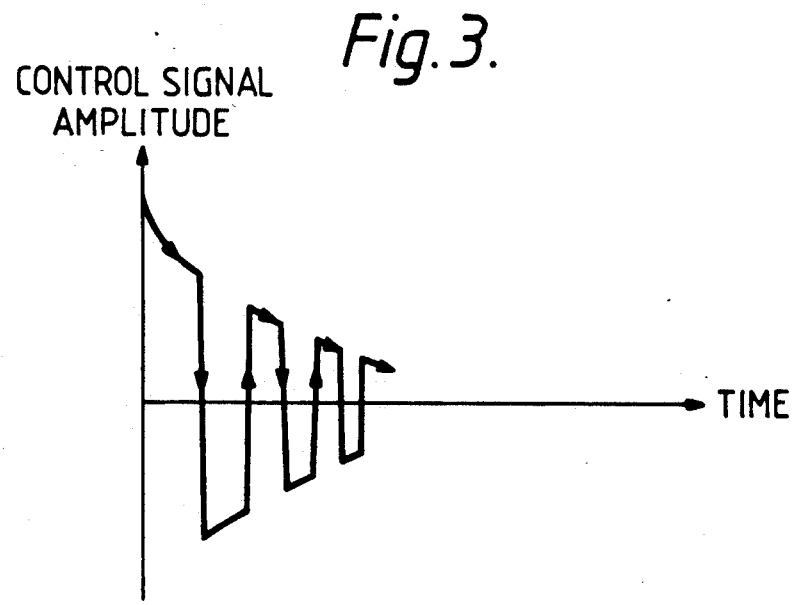
FIG. 3 illustrates a switching control signal generated by a variable structure controller in accordance with the invention.
Figure 4:
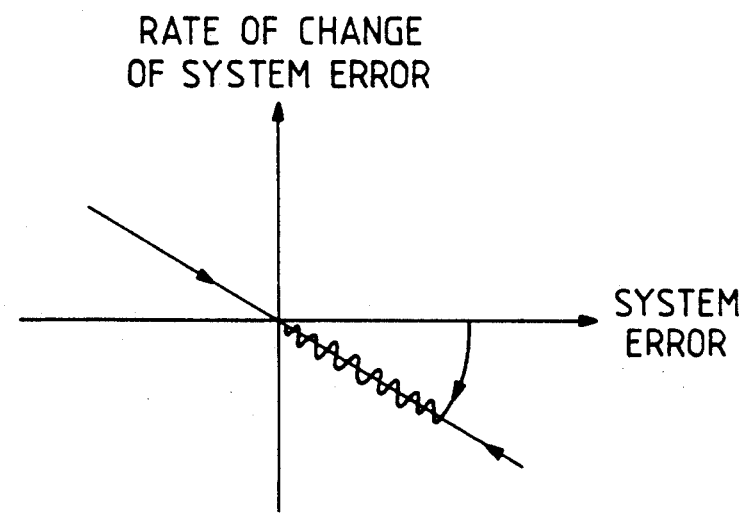
FIG. 4 illustrates the error trajectory obtained for the switching control signal of FIG. 3.
Figure 5:
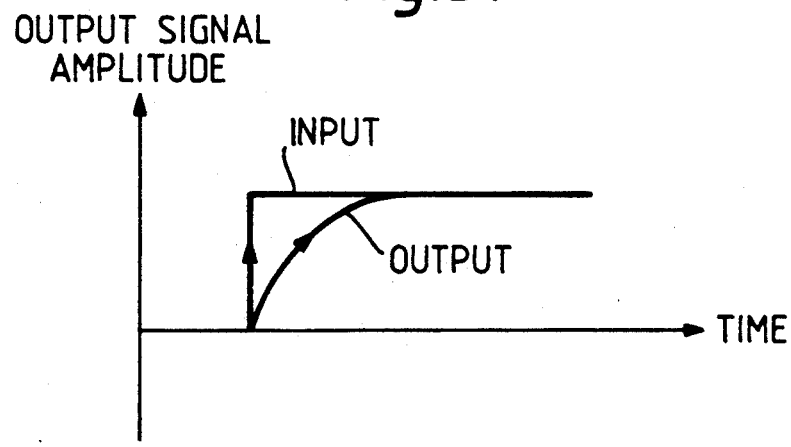
FIG. 5 shows the output of an adaptive control system in accordance with the invention for a step input.

In a variable structure control system, the feedback structure of the system is switched, almost instantaneously, back and forth from one feedback controller to another. Typical system error trajectories for the two types of feedback controller (positive and negative) used in this invention are illustrated in FIGS. 1 and 2 respectively. A typical switching control signal is shown in FIG. 3 which results in an error trajectory of FIG. 4 and a step response of FIG. 5.

Figure 6:
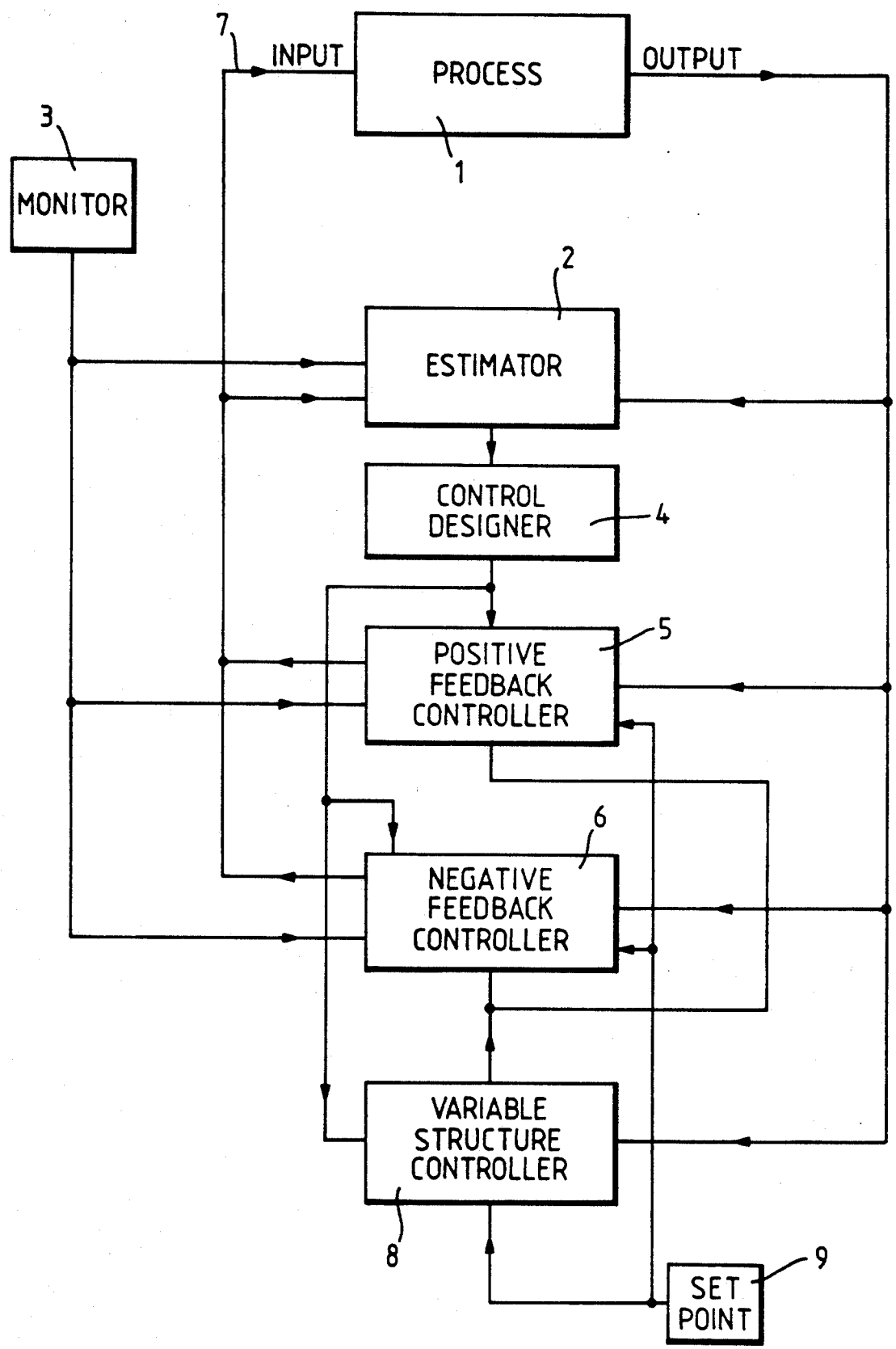
FIG. 6 is a block diagram of an adaptive control system in accordance with the invention.

FIG. 6 shows a process (or plant) 1 which is to be adaptively controlled. An estimator 2 receives information relating to the status or operating condition of the process. Such information can relate to any external disturbances, detected by a monitor 3, to which the process 1 is susceptible and to the output status of the process 1 itself. The estimator 2 thus generates process model parameters that best describe the response of the controlled process-in other words it generates a simulation of the process according to the information it receives.

The process model parameters output from the estimator are input to a control designer 4 which compares these parameters with the required parameters for the process. The required parameters are derived from an algorithm representing the characteristics shown in FIGS. 1 and 2 which is stored in the control designer. The control designer then calculates positive and negative feedback signals from the most recently derived process model parameters.

Said feedback signals are applied to a positive feedback controller 5 and to a negative feedback controller 6. These controllers act as filters and generate a process control input on line 7. Switching between the feedback controllers 5 and 6 is effected by the output from a variable structure controller 8 which receives information from the output of the control designer 4, the output of the process 1 and a set point signal. The set point signal is the desired process output and is derived, for example, from a manually operated potentiometer 9. The set point signal is also applied to each feedback controller 5 and 6 along with the process output.

The embodiment of FIG. 6 having two feedback controllers is a simple, second order control system. Higher order systems can be provided by the addition of further switched feedback controllers.

Conveniently, the Delta operator, proposed by Goodwin in "Some Observations on Robust Estimation and Control"-IFAC Identification and System Parameter Estimation 1985 pp 851-859, is used to derive the algorithms for the estimator, control designer and variable structure controller.

In this example a forward difference operator i.e. the 'delta' operator "D" can be denoted as:

$$D = \frac{Z-1}{\Delta} \quad (1)$$

where Z represents the Z transform and can be thought of as the standard forward shift operator in discrete system analysis, and $\Delta$ is the sampling period.

A prediction, therefore, of one sample into the future is required but this can be eliminated if the difference operator is delayed by one sample.

$$\text{ie } Z^{-1}D = Z^{-1}\frac{(Z-1)}{\Delta} \quad (2)$$

Thus as $\Delta \rightarrow 0$ then the $Z^{-1}D$ operator provides a better approximation of the continuous derivative. For discrete systems analysis directly comparable with Z-transforms the difference operator (2) can be normalised ($\Delta = 1$) giving a discrete difference operator of the form:

$$Z^{-1}D = Z^{-1}(Z-1) \quad (3)$$

This discrete operator provides an elegant way of representing discrete processes in difference form with poles and zeros in the unit disc. In the analogy that follows the discrete difference operator is used to formulate a discrete sliding criterion.

If $\sigma(t)$ represents the sliding manifold (or switching signal; generated by the variable structure controller 8), in the phase plane, then the existence of the sliding motion is guaranteed by the following inequality:

$$\sigma(t)\frac{d\sigma(t)}{dt} < 0 \quad (4)$$

where $$\sigma(t) = x_2 + Cx_1 \quad (5)$$

where
C=sliding manifold slope. (See FIG. 4)
$x_1$=process output or error
$x_2$=rate of change of $x_1$ The $Z^{-1}D$ operator can be used to provide a discrete analogy of the sliding criterion. i.e.

$$\sigma(t)\frac{d\sigma(t)}{dt}$$

can be written as $$Z^{-1}(\sigma(t).D\sigma(t))$$

Thus;

$$\sigma(t) \approx Z^{-1}((x_1(t+1)-x_1(t))+Cx_1(t)) \approx (D+C)x_1(t-1) \quad (7)$$

and $$\frac{d\sigma(t)}{dt} \approx Z^{-1}(\sigma(t+1) - \sigma(t))$$
$$\approx (Z^{-1}(D+C) - Z^{-2}(D+C))x_1(t)$$

Therefore the sliding criterion (4) can be expressed as:

$$(Z^{-1}(D+C)-Z^{-2}(D+C))x_1(t)\sigma(t-1)<0 \quad (8)$$

$$\therefore Z^{-2}(Z(D+C)-(D+C))x_1(t)\sigma(t-1)<0$$

$$\therefore ((D+1)(D+C)-(D+C)x_1(t-2)\sigma(t-1)<0$$

This reduces to:

$$(D^2+CD)x_1(t-2)\sigma(t-1)<0 \quad (9)$$

Inequality (9) is the basic necessary sliding criterion in difference form but it is not sufficient for the existence of a quasi-sliding motion. For sufficiency the convergence of the discrete states must be guaranteed in the sliding mode. To ensure sufficiency the following inequality may be stated as $$Z^{-1}D|\sigma(t)|<0$$

The control strategy and hence the discrete variable structure algorithm described above is particularly useful for the control of processes incorporating magnetostrictive devices.

Recent work in the field of ferromagnetic materials has resulted in the development of so called 'giant' magnetostrictive materials. There are at present two compositions of giant magnetostrictive materials using Terbium known to the applicant, namely:

i. $Tb_{0.3}Dy_{0.7}Fe_{1.9-1.95}$ ii. $Tb_{0.27}Dy_{0.73}Fe_{1.9-1.95}$ where, Tb=Terbium, Dy=Dysprosium and Fe=Iron and numerals refer to atomic ratios.

Figure 7:
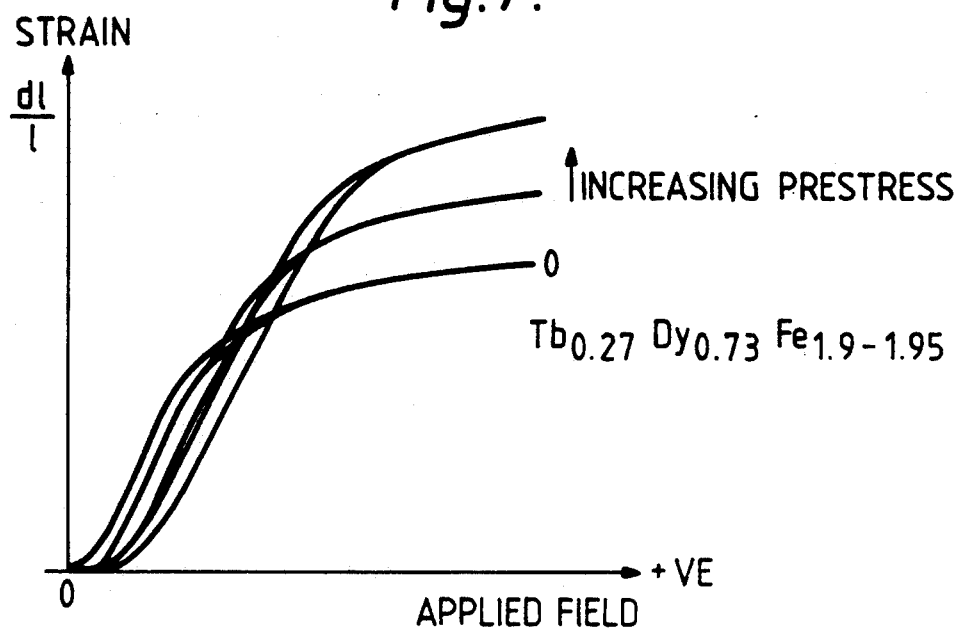
FIG. 7 is a graph showing the relationship between strain and magnetic field intensity for composition $Tb_{0.27}Dy_{0.73}Fe_{1.9-1.95}$ operating under different levels of prestressing.
Figure 8:
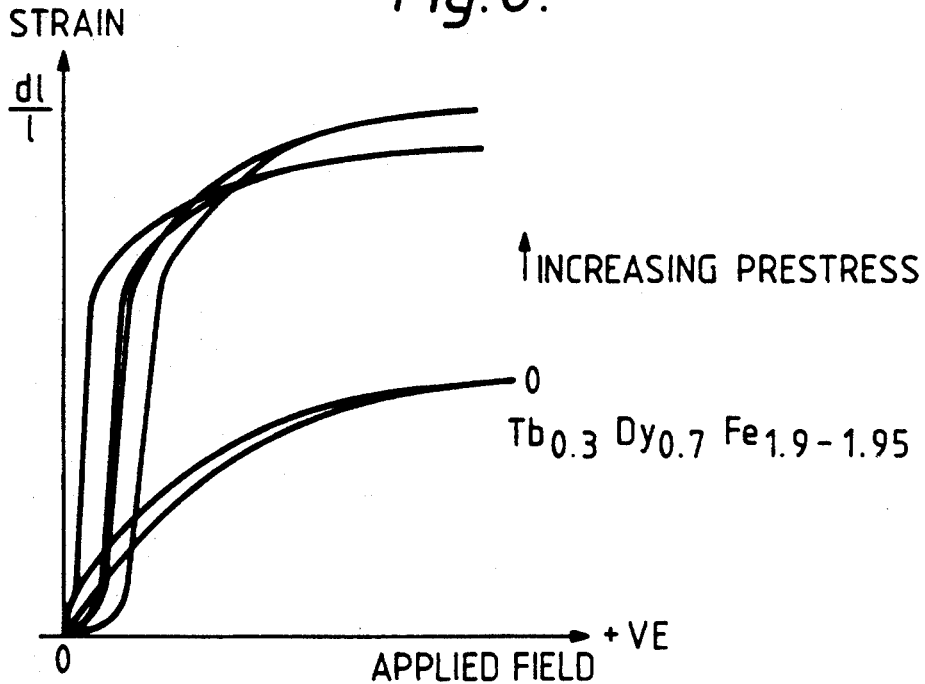
FIG. 8 is a graph showing the relationship between strain and magnetic field intensity for composition $Tb_{0.3}Dy_{0.7}Fe_{1.9-1.95}$ operating under different levels of prestressing.

Both compositions are capable of developing linear strains of between 1000 to 2000 ppm dependent upon the level of prestress applied to the material and the intensity of the magnetic field to which the material is exposed. The inter-relationship between strain, prestress and magnetic field intensity for each of the two compositions is shown in FIGS. 7 and 8. The efficiency of these two known compositions in converting magnetic energy supplied by an external magnetic field into strain energy, i.e. displacement, can be as much as 50% or even greater (the 0.27 Terbium composition has a slightly greater efficiency than the 0.3 composition) and a rod of giant magnetostrictive material can operate under external uni-axial pressure of as much as 100 MPa, although the diameter of the rod will, of course, determine its maximum load bearing capability.

Whilst the properties of magnetostrictive materials, and more particularly giant magnetostrictive materials comprised of Terbium, have been explored and determined as described in the preceding paragraph, they have yet to find many useful applications. Reasons for this are the non-linear behaviour of and the presence of hysteresis in the strain versus magnetic field intensity curves. Hysteresis depends upon loading and variations in the material characteristics. However, the non-linear and hysteretic behaviour as illustrated in FIGS. 7 and 8 can be accommodated quite satisfactorily by the adaptive controller as described above. The estimator 2 is able to follow any changes in slope of the characteristic curve and the variable structure controller 8 will account for any hysteresis.

A magnetostrictive actuator controlled by an adaptive controller in accordance with the invention will now be described with reference to FIGS. 9 and 10.

Figure 9:
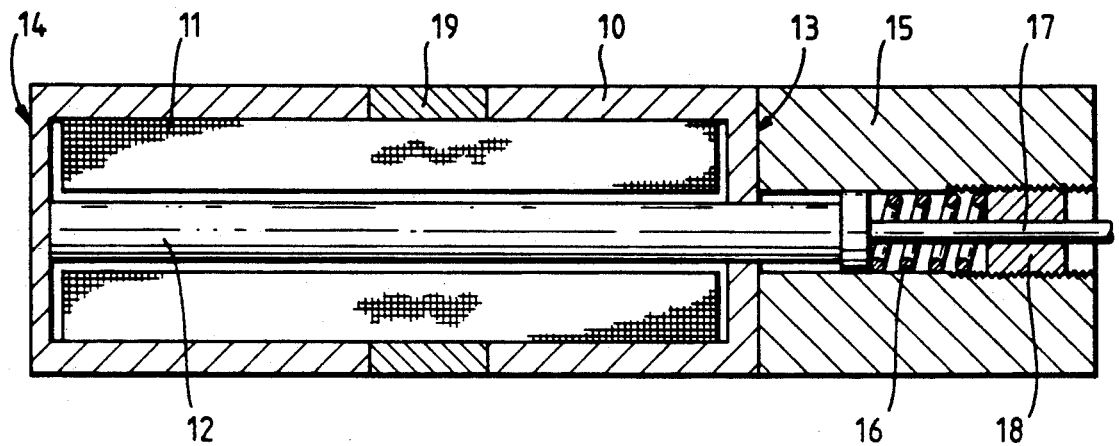
FIG. 9 is a longitudinal cross section of a magnetostrictive actuator.
Figure 10:
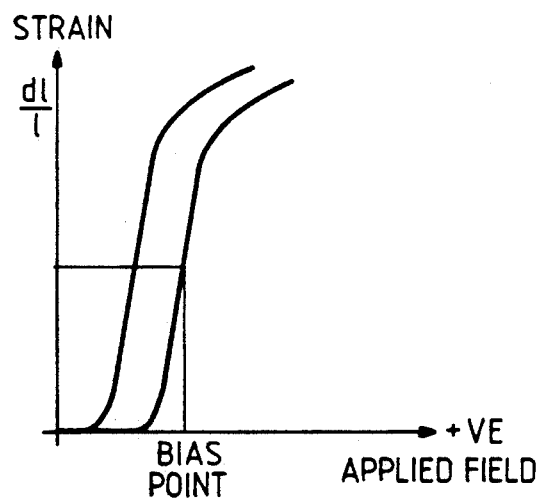
FIG. 10 is a graph showing the relationship between strain and magnetic field intensity when a magnetic bias is applied to the magnetostrictive actutator of FIG. 9.

In FIG. 9 there is shown a longitudinal section of a magnetostrictive actuator comprising a hollow cylindrical housing 10 within which is located a tubular magnetising coil 11 and, co-axial with the coil 11, a rod 12 of magnetostrictive material. The length of the rod 12 is greater than that of the housing 10 and one end of the rod 12 therefore extends through and beyond an aperture provided in an end face 13 of the housing 10. The opposite end face 14 of the housing 10 is closed and the other end of the rod 12 abuts against it.

A loading head 15 is secured to the end face 13 of the housing 10 and accommodates the free end of the rod 12 in a longitudinal bore extending the full length thereof. Within the longitudinal bore there are housed a spring 16, an actuating member 17 and a screw threaded closure member 18. The screw threaded closure member 18 is screw threadedly received in the outer end of the through bore in the loading head 15. This end of the through bore is tapped in order to accommodate the closure member 18. The spring 16 and the actuating member 17 are enclosed within the through bore in the loading head 15 between the end of the magnetostrictive rod 12 and the closure member 18, and, by screwing the closure member 18 further in or out of the through bore the tension in the spring 16 can be varied to adjust the prestressing applied to the rod 12. This facility to adjust the level of prestressing allows the actuator to be used in different operating conditions. The level of prestressing will vary in accordance with the degree of compression in the spring 16 and therefore it is desirable to operate the actuator in the middle of the spring operating capacity. The spring 16 is chosen to ensure that when the rod 12 expands the change in the level of prestress is kept to about 1%. Prestressing is of particular benefit in cases where the rod 12 is composed of grain-oriented materials. In addition, the spring 16 is chosen to have a high rate constant in order to allow the actuator to operate at high frequencies.

One end of the actuating member 17 abuts against that end of the magnetostrictive rod 12 which protrudes beyond the end face 13 of the housing 10, and the other end of said member 17 extends through the bore of the closure member 18 and beyond the outer end of the loading head 15. In use the actuating member 17 is connected to an element which is to be displaced in accordance with a process control signal generated by the adaptive controller of FIG. 6. Said signal is applied to the magnetising coil 11.

If it is a requirement for the magnetostrictive rod 12, once prestressed, to operate in the linear region of its strain curve then it must be biased. The operating characteristic of a magnetostrictive rod for a particular bias point is shown in FIG. 10.

A static (dc) magnetic bias can be applied to the rod 12 by means of a permanent magnet 19 mounted in the housing 10.

Alternatively, a current-carrying coil would serve equally well. It is necessary for the magnetic bias to form part of the same magnetic circuit as the rod 12. With the magnetic bias provided by a permanent magnet, the effective level of biasing can be altered by moving a piece of high permeability material across the magnet or by removing part of the magnet from the magnetic circuit, so permitting adjustments to be made in keeping with operating conditions. In the case of a dc magnetising coil the magnetic bias is varied by varying the applied current.

Whether the magnetic biasing is provided by a coil or by a permanent magnet 19, it is preferable for the rod 12 to be enclosed in a magnetic circuit so that most of the magnetic flux produced by the magnetising coil 11 and by the magnetic bias passes through the rod 12. To this end the housing 10 is comprised of a high permeability material which provides a continuous low resistance magnetic flux return path. The flux return path provided by the housing must have a greater permeability to flux than either the permanent magnet 19 or the rod 12, but the cross-sectional area of the flux return path must be such that the material used will neither saturate nor require excessive magnetic energy to establish the magnetic flux for the rod 12.

In use, when a control signal is applied to the coil 11 a magnetic field is created and magnetic flux flows in the rod 12. This causes the length of the rod 12 to change either by contracting or expanding about the bias point provided by the permanent magnet. Of course, as the length of the rod 12 changes so too does the position of the end of the actuating member 17. Thus, the actuator can be used to actuate by displacement another device or mechanism.

A typical magnetostrictive rod of either of the aforementioned compositions is capable of developing strains of between 1000 to 2000 ppm dependent on the relevant optimum prestress applied to the material and can operate with an external load of approximately 100 MPa of pressure. Typically, this translates into a change of length of approximately 0.12 mm for a rod of approximately 142 mm in length and this change in length will occur even under pressures as high as 100 MPa. In order to ensure adequate displacement of the device of mechanism to be actuated the output of the actuator can be amplified by means of a mechanical amplification system, such as levers or gears.

The adaptive control system of FIG. 6 in combination with the magnetostrictive actuator of FIG. 9 can be used for control of hydraulic valves.

Valves which are retracted by solenoids suffer from lack of control (i.e. the valve is either open or shut) and the greater the power required to operate the valve, the more uncontrolled its movement. Control can be achieved by replacing the solenoid with an electric motor but this is at the expense of actuation speed.

By using a magnetostrictive actuator controlled by an adaptive control system in accordance with the invention to operate a valve, both high speed and controlled actuation can be obtained. The valve could then provide prescribed flow rates on demand and, unlike motor driven valves, it would be fail-safe.

Figure 11:
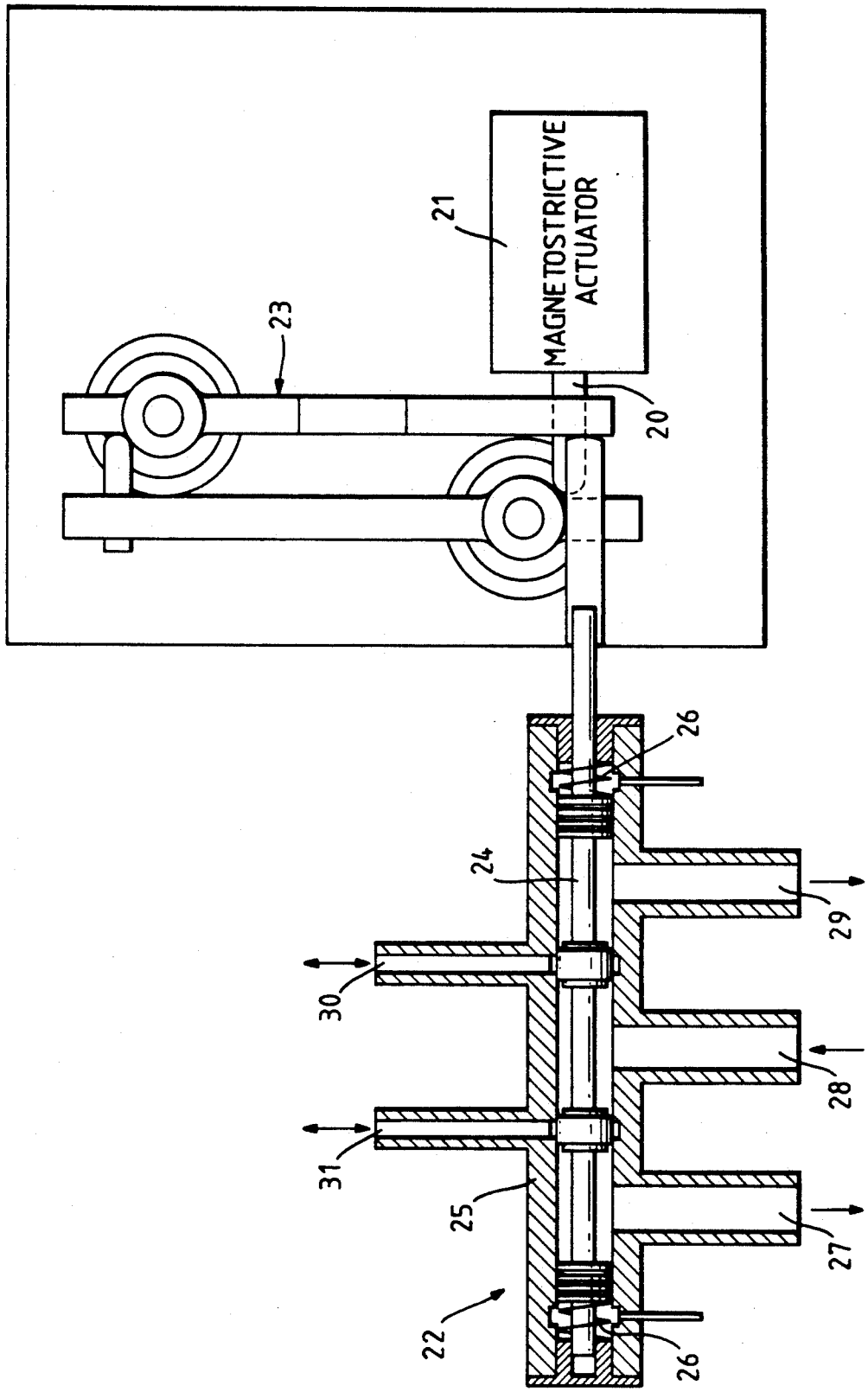
FIG. 11 is a schematic view of a 5 port-2 position hydraulic reversing valve operated by a magnetostrictive actuator which is controlled by an adaptive control system in accordance with the invention.

In FIG. 11 an actuating member 20 of a magnetostrictive actuator 21 of the type described with reference to FIG. 9 is connected to a 5 port-2 position reversing valve unit indicated generally by reference numeral 22, via a mechanical displacement amplifying lever system 23. The valve unit 22 is of conventional design and therefore it is not considered necessary to describe it in detail herein, save to say that it comprises a spool 24 which is axially displaceable within the valve body 25 against a return spring 26 provided at each end thereof to control the flow of a liquid between inlet/outlet ports 27 to 31.

Means are provided for obtaining information regarding the operating conditions of the valve. This information includes the spool position, the differential pressure across the valve and/or user demand (i.e. the set point input). This information is used by the adaptive control system of FIG. 6 to generate appropriate input control signals to the actuator 21 and thereby ensure that the actuating member 20 is displaced in the right direction and by the required amount to achieve the required operating conditions.

Because the actual distance through which the end of the actuating member 20 moves is small, of the order of 0.12 mm, the amplifying system 23 is provided between the valve spool 24 and the actuating member 20. This amplifies the movement in the approximate ratio 70:1, resulting in a maximum displacement of the spool 24 by 8 mm. Response times of 1 mS or less can be achieved and a minimum force of approximately 8 kg is exerted on the spool return spring 26.

Figure 12:
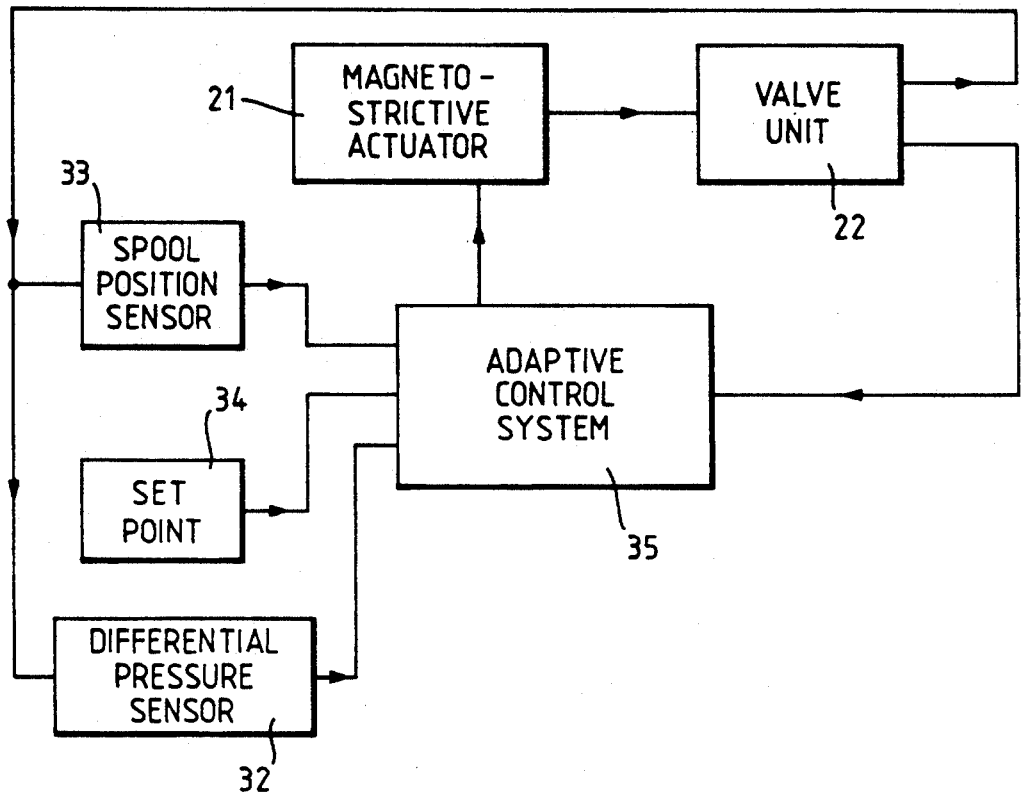
FIG. 12 is a block diagram showing the control system of the actuator-operated valve of FIG. 11

Referring now to FIG. 12, signals from a differential pressure sensor 32, a spool position sensor 33 and a set-point transducer 34 are input to an adaptive control system 35 of a type according to the invention. The control system 35 thus generates an input control signal for the magnetising coil of the magnetostrictive actuator 21 to obtain a given displacement of the actuating member 20 and thence the valve spool incorporated within the valve unit 22.

Figure 13:
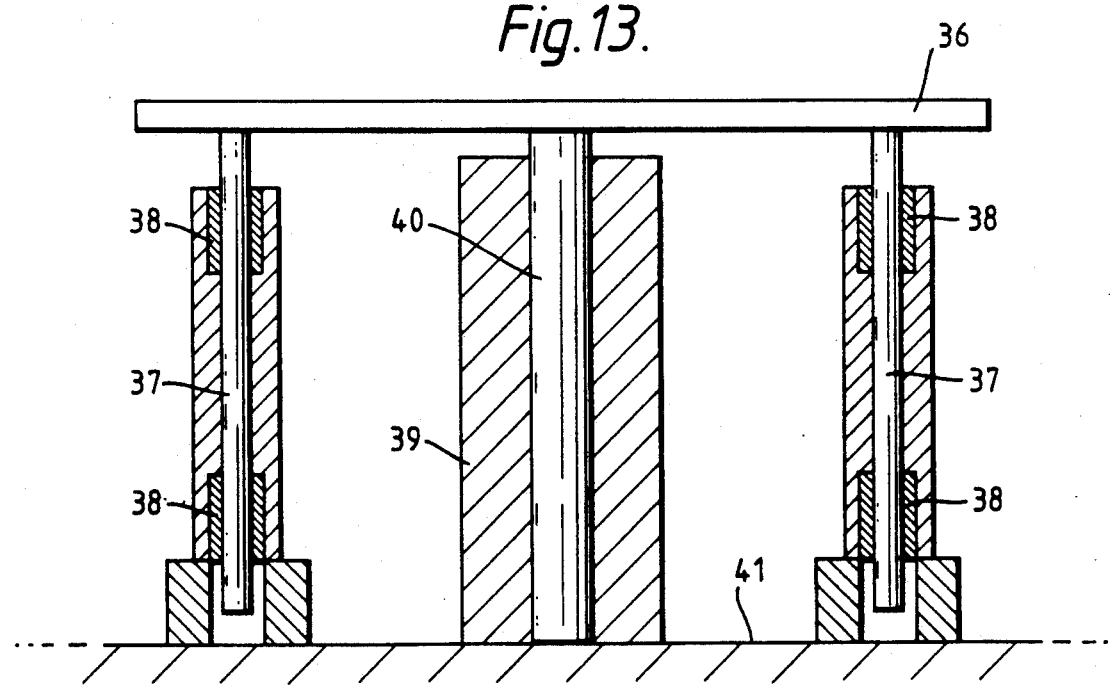
FIG. 13 is a schematic sectional view of an anti-vibration table including a magnetostrictive actuator which is operated by an adaptive control system in accordance with the invention.

In a further example of the use to which the adaptive control system of FIG. 6 and a magnetostrictive actuator may be put, reference is now made to the anti-vibration table shown in FIG. 13. The table comprises a flat horizontal member 36 which forms the table top and which is supported at each corner by a guide leg 37 mounted in linear bearings 38. Located centrally and underneath the table is a magnetostrictive actuator. The actuator comprises a housing 39 containing a magnetostrictive rod 40 and a magnetising coil (not shown). The housing sits on the floor 41 and the rod 40 supports the central portion of the table. Of course, whilst only one actuator is shown in FIG. 13, more may be used if the working loads on the anti-vibration table are such that one would be insufficient to cope.

Vibration sensors (not shown) are provided in the guide legs of the table or the floor and the output of each of these sensors is input to an adaptive control system of a type in accordance with the invention (not shown). The control system generates a control signal which, when applied to the magnetising coil of the magnetostrictive actuator, causes the rod 40 to move by an equal, but opposite amount relative to the floor. In other words, if, for example, the floor vibrates at an amplitude of 0.1 mm and a frequency of 10 Hz, the magnetostrictive rod will vibrate up and down with the same frequency and amplitude, but in anti-phase with the incoming signal with the result that the table top is stationary.

As will be apparent, the table top 36 is able to move up and down relative to the floor (the guide legs are slideably supported in the linear bearing 38) but it actually maintains a constant position in space and is therefore stationary—any movement of the floor is compensated for by the actuator device supporting the table top.

The anti-vibration techniques described herein can also be applied to the problems of vibration control in towed sonar arrays. It has been found, however, that the working loads which are generated in a typical tow line are such that a single magnetostrictive actuator is inadequate. The solution to this problem is to use a plurality of actuators aligned side by side and operate them in parallel from one adaptive control system.

We claim:

1. A magnetostrictive actuator comprising:
    a generally cylindrical housing having an open end and a closed end;
    a rod of magnetostrictive material having two ends, said rod retained within said housing, one of said ends retained by the closed end of said housing;
    a transverse wall at the open end of said housing which defines a cavity between said wall and said rod;
    spring means for applying an adjustable axial compressive stress to an other of said ends of said rod;
    an electromagnet incorporated in said housing and magnetically coupled to said rod;
    means for generating a control current within said electromagnet, said control current and said electromagnet comprising a means for inducing a corresponding magnetic field within said rod; and
    an actuating member, extending through said transverse wall and in contact with said rod, an axial position of said actuating member, relative to the housing, responsive to the length of said rod wherein said actuating member is connected to control a process in response to an externally-generated demand signal, and said means for generating a control current includes a control system comprising:

an estimator for providing a model of the response of said process to external influences;

a control designer, responsive to said estimator, for comparing the model provided by said estimator with a stored model and for generating feedback control signals as a result of such comparison;

two switched filters for applying to the control current positive and negative feedback signals, respectively; and a variable structure controller for controlling switching between said two filters in response to said demand signal.

2. A magnetostrictive actuator according to claim 1 in which said transverse wall of said housing is comprised of a threaded plug threadedly engageable with said housing, wherein rotation of said plug causes axial movement of said plug, a change in length of said cavity and a change in axial stress exerted by said spring means on said other end of said rod.

3. A magnetostrictive actuator according to claim 1 in which the housing incorporates a permanent bias magnet, said magnet together with said rod comprising a magnetic bias flux circuit, said actuator further comprising a means for varying magnetic flux in said rod comprising an element of high permeability material movable across said permanent magnet thereby varying the magnetic bias flux through said rod.

4. A magnetostrictive actuator as claimed in claim 1 further including an anti-vibration table and means for taking measurements of unwanted vibrations transmitted thereto and for transmitting the measurements to the adaptive control system, and in which the table legs are supported in bearings and free to move therein and the table top is supported by the rod which moves in response to the control signals and in anti-phase with the transmitted vibrations so that the table top remains stationary in space.

5. A magnetostrictive actuator comprising:

a generally cylindrical housing having an open end and a closed end;

a rod of magnetostrictive material having two ends, said rod retained within said housing, one of said ends retained by the closed end of said housing;

a transverse wall at the open end of said housing which defines a cavity between said wall and said rod;

means for applying an adjustable axial stress to an other of said ends of said rod;

an electromagnet incorporated in said housing and magnetically coupled to said rod;

means for generating a control current within said electromagnet, said control current and said electromagnet comprising a means for inducing a corresponding magnetic field within said rod; and an actuating member, extending through said transverse wall and in contact with said rod, an axial position of said actuating member, relative to the housing, responsive to the length of said rod wherein said actuating member is connected to control a process in response to an externally-generated demand signal, and said means for generating a control currently includes a control system:

an estimator for providing a model of the response of said process to external influences;

a control designer, responsive to said estimator, for comparing the model provided by said estimator with a stored model and for generating feedback control signals as a result of such comparison;

two switched filters for applying to the control current positive and negative feedback signals, respectively; and a variable structure controller for controlling switching between said two filters in response to said demand signal.

6. A magnetostrictive actuator according to calim 5 in which said transverse wall of said housing is comprised of a threaded plug threadedly engageable with said housing, wherein rotation of said plug causes axial movement of said plug, a change in length of said cavity and a change in axial stress exerted by said spring means on said other end of said rod.

7. A magnetostrictive actuator according to claim 5 in which the housing incorporates a permanent bias magnet, said magnet together with said rod comprising a magnetic bias flux circuit, said actuator further comprising a means for varying magnetic flux in said rod comprising an element of high permeability material movable across said permanent magnet thereby varying the magnetic bias flux through said rod.

8. A magnetostrictive actuator as claimed in claim 5 further including an anti-vibration table and means for taking measurements of unwanted vibrations transmitted thereto and for transmitting the measurements to the adaptive control system, and in which the table legs are supported in bearings and free to move therein and the table top is supported by the rod which moves in response to the control signals and in anti-phase with the transmitted vibrations so that the table top remains stationary in space.

* * * * *